(12) United States Patent
Yuan et al.

(10) Patent No.: US 8,816,461 B2
(45) Date of Patent: Aug. 26, 2014

(54) DICHROMATIC PHOTODIODES

(75) Inventors: Ping Yuan, Simi Valley, CA (US); Xiaogang Bai, South Pasadena, CA (US); Rengarajan Sudharsanan, Stevenson Ranch, CA (US)

(73) Assignee: The Boeing Company, Chicago, IL (US)

( * ) Notice: Subject to any disclaimer, the term of this patent is extended or adjusted under 35 U.S.C. 154(b) by 0 days.

(21) Appl. No.: 13/230,847

(22) Filed: Sep. 13, 2011

(65) Prior Publication Data

US 2013/0062663 A1    Mar. 14, 2013

(51) Int. Cl.
   *H01L 31/00* (2006.01)
   *H01L 21/02* (2006.01)
   *H01L 31/102* (2006.01)
   *H01L 21/00* (2006.01)

(52) U.S. Cl.
   USPC ........... 257/440; 257/441; 257/185; 257/458; 257/E31.061; 257/E31.064; 438/74

(58) Field of Classification Search
   USPC ............... 257/74, 185, 441–442, 440; 438/74
   See application file for complete search history.

(56) References Cited

U.S. PATENT DOCUMENTS

| 4,297,720 A | 10/1981 | Nishizawa et al. |
| 4,820,915 A | 4/1989 | Hamakawa et al. |
| 5,818,051 A | 10/1998 | Dreiske et al. |
| 6,281,561 B1 * | 8/2001 | Stiebig et al. ................. 257/440 |
| 2003/0218175 A1 | 11/2003 | Ogawa et al. |
| 2006/0076636 A1 * | 4/2006 | Fukunaga ..................... 257/432 |
| 2007/0131977 A1 * | 6/2007 | Boisvert et al. ............... 257/233 |

FOREIGN PATENT DOCUMENTS

| GB | 2136202 A | 9/1984 |
| JP | 55093275 | 1/1979 |
| WO | WO2005073485 A3 | 8/2005 |

OTHER PUBLICATIONS

Fasnacht, D. and Delbruck, T. "Dichromatic spectral measurement circuit in vanilla CMOS", IEEE International Symposium on Circuits and Systems (ISCAS 2007) 3091-3094, 2007.

Combined Search and Examination Report, GB1216408.3, Dec. 24, 2011.

* cited by examiner

*Primary Examiner* — Daniel Luke (74) *Attorney, Agent, or Firm* — Ameh IP; Lowell Campbell; Elahe Toosi (57) ABSTRACT

A dichromatic photodiode and method for dichromatic photodetection are disclosed. A wide bandgap junction comprises a lattice matched junction operable to detect a first light spectrum. A narrow bandgap junction is coupled to the wide bandgap junction, and comprises a photodiode structure. The narrow bandgap junction is operable to detect a second light spectrum.

22 Claims, 5 Drawing Sheets

DICHROMATIC PHOTODIODES

FIELD

Embodiments of the present disclosure relate generally to electro optics. More particularly, embodiments of the present disclosure relate to electro optics devices.

BACKGROUND

Objects generally emit infrared radiation across a spectrum of wavelengths, but sometimes only a limited region of the spectrum is of interest because sensors usually collect radiation only within a specific bandwidth. Multi-spectral imaging captures image data at frequencies across an electromagnetic spectrum, and can allow extraction of additional information that a human eye may fail to capture with visible red, green and blue light receptors. Multi-spectral imaging divides a spectrum into many bands, in contrast to only recording a total intensity of radiation falling on each pixel.

Wavelengths of frequencies may be separated by filters or by use of instruments that are sensitive to particular wavelengths. For example, light from frequencies may be beyond a visible light range such as infrared light. It may be desirable to acquire one digital image in a band of visible spectra, for example a range of about 0.7 µm to about 0.4 µm, called a red-green-blue (RGB) region, and also in infra-red wavelengths of about 0.7 µm to about 10 µm or more.

A boundary between visible and infrared light is not precisely defined. A human eye is markedly less sensitive to light above about 700 nm wavelength, so longer wavelengths may make limited contributions to scenes illuminated by common light sources. An onset of infrared may be defined according to a variety of standards at various values generally between about 700 nm and about 800 nm wavelength.

Infrared spectrum is often subdivided into smaller sections due to different sensor responses to infrared light. For example, near infrared may be a spectrum region closest in wavelength to radiation detectable by a human eye, and mid infrared and far infrared may be progressively further from a visible spectrum. The infrared spectrum may be divided into bands based on availability of light sources transmitting, absorbing materials (e.g., optical fibers) and detectors. For example, short-wavelength infrared (SWIR), Near InfraRed (NIR), Middle InfraRed (MIR), and Far InfraRed (FIR) or thermal, are commonly used references for frequency bands. SWIR may generally be variously defined by, for example, about 1 to about 3 µm, about 1.4 to about 3 µm, or similar range. Spectral imaging with numerous bands, fine spectral resolution, and wide spectral coverage may be called "hyperspectral".

SUMMARY

A dichromatic photodiode and method for dichromatic photodetection are disclosed. A wide bandgap junction comprises a lattice matched junction operable to detect a first light spectrum. A narrow bandgap junction is coupled to the wide bandgap junction, and comprises an avalanche photodiode (APD) structure. The narrow bandgap junction is operable to detect a second light spectrum.

In this manner, a dichromatic photodiode is provided to extend an SWIR camera sensitivity range to a visible region. Extending the SWIR camera sensitivity range to a visible region may expand SWIR sensor technology to many more applications and allow higher levels of integration. The dichromatic photodiode greatly reduces difficulty in integration of multiple band photo detection and imaging. The photodiodes and arrays cover multiple optical bands with high efficiency and density, which give a competitive edge in camera image quality, integration, weight, volume, and power consumption.

In an embodiment, a dichromatic photodiode comprises a wide bandgap junction coupled to a narrow bandgap junction. The wide bandgap junction comprises a lattice matched junction operable to detect a first light spectrum. The narrow bandgap junction comprises a photodiode structure operable to detect a second light spectrum.

In another embodiment, a method for dichromatic photodetection detects a first light spectrum via a wide bandgap junction. The wide bandgap junction comprises a lattice matched junction. The method further detects a second light spectrum via a narrow bandgap junction coupled to the wide bandgap junction. The narrow bandgap junction comprises a photodiode structure.

In yet another embodiment, a method for providing a dichromatic photodiode provides a wide bandgap junction comprising a lattice matched junction. The method further configures the wide bandgap junction to detect a first light spectrum, and provides a narrow bandgap junction comprising a photodiode structure. The method further configures the narrow bandgap junction to detect a second light spectrum and couples the narrow bandgap junction to the wide bandgap junction.

This summary is provided to introduce a selection of concepts in a simplified form that are further described below in the detailed description. This summary is not intended to identify key features or essential features of the claimed subject matter, nor is it intended to be used as an aid in determining the scope of the claimed subject matter.

BRIEF DESCRIPTION OF DRAWINGS

A more complete understanding of embodiments of the present disclosure may be derived by referring to the detailed description and claims when considered in conjunction with the following figures, wherein like reference numbers refer to similar elements throughout the figures. The figures are provided to facilitate understanding of the disclosure without limiting the breadth, scope, scale, or applicability of the disclosure. The drawings are not necessarily made to scale.

DETAILED DESCRIPTION

The following detailed description is exemplary in nature and is not intended to limit the disclosure or the application and uses of the embodiments of the disclosure. Descriptions of specific devices, techniques, and applications are provided only as examples. Modifications to the examples described herein will be readily apparent to those of ordinary skill in the art, and the general principles defined herein may be applied to other examples and applications without departing from the spirit and scope of the disclosure. The present disclosure should be accorded scope consistent with the claims, and not limited to the examples described and shown herein.

Embodiments of the disclosure may be described herein in terms of functional and/or logical block components and various processing steps. It should be appreciated that such block components may be realized by any number of hardware, software, and/or firmware components configured to perform the specified functions. For the sake of brevity, conventional techniques and components related to photodiodes, semiconductors, microelectronics, and other functional aspects of systems described herein (and the individual operating components of the systems) may not be described in detail herein. In addition, those skilled in the art will appreciate that embodiments of the present disclosure may be practiced in conjunction with a variety of hardware and software, and that the embodiments described herein are merely example embodiments of the disclosure.

Embodiments of the disclosure are described herein in the context of a practical non-limiting application, namely, a photodiode. Embodiments of the disclosure, however, are not limited to such photodiode applications, and the techniques described herein may also be utilized in other applications. For example but without limitation, embodiments may be applicable to solar cells, motion detectors, and other light processing applications.

As would be apparent to one of ordinary skill in the art after reading this description, the following are examples and embodiments of the disclosure and are not limited to operating in accordance with these examples. Other embodiments may be utilized and structural changes may be made without departing from the scope of the exemplary embodiments of the present disclosure.

Multiband image fusion is an important trend in imaging technology. For small aerial platforms and hyperspectral imaging, integration of multiple band detectors into a sensor array may be essential for saving size, weight and power (SWAP). For commercial applications, such as but without limitation, biomedical imaging, wavelength coverage from visible to SWIR may be substantially ideal.

Embodiments of the disclosure provide a dichromatic photodiode, which can extend an SWIR camera sensitivity range to a visible region. Extending the SWIR camera sensitivity range to a visible region may expand SWIR sensor technology to many more applications and allow higher levels of integration.

By utilizing a lattice-matched dual-junction structure, two photodiodes operating at different wavelength ranges can be integrated into a signal epitaxial structure. By operating each junction of the lattice-matched dual-junction structure in linear mode, images at more than one wavelength can be acquires with a single array. Higher image contrast may be achieved with fusion of images from more than one wavelength, which can be overlapped and synchronized.

A dichromatic structure of the lattice-matched dual-junction structure can be applied to various photodiodes, such as but without limitation, P-I-N diodes, avalanche photodiodes (APD), photo conductors, and other semiconductor diodes. Due to a compact nature of such integration, the dichromatic photodiodes described herein can be substantially easy to scale to large-format arrays. For example, in an indium phosphide/indium gallium arsenide (InP/InGaAs) lattice matched material system, a long wavelength range can be covered by a dichromatic photodiode with an InGaAs absorber, while a short wavelength range can be detected by an indium phosphide (InP) absorber of the dichromatic photodiode.

Figure 1:
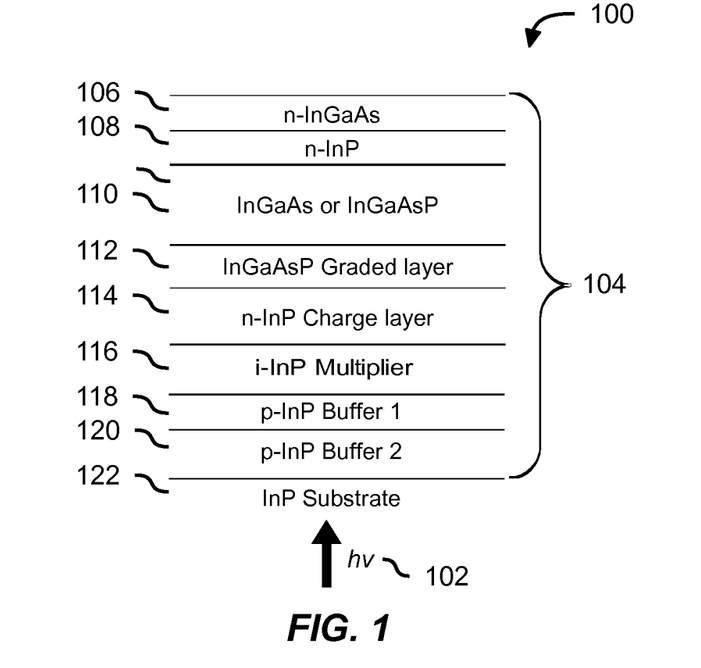
FIG. 1 is an illustration of an exemplary avalanche photodiode.

FIG. 1 is an illustration of an exemplary avalanche photodiode 100. The avalanche photodiode 100 comprises an avalanche photodiode (APD) structure 104, and an indium phosphide (InP) substrate 122 (InP substrate 122). The APD structure 104 may comprise a contact negatively doped (n-type) indium gallium arsenide (InGaAs) (n-InGaAs) layer 106 (n-InGaAs layer 106), an n-type indium phosphide (n-InP) layer 108 (n-InP layer 108), an InGaAs/InGaAs phosphide (InGaAsP) absorption layer 110 (InGaAsP layer 110), an indium gallium arsenide phosphide (InGaAsP) graded layer 112 (InGaAsP graded layer 112), a negatively doped indium phosphide (n-InP) charge layer 114 (n-InP charge layer 114), an intrinsic (i-type) InP (i-InP) multiplier layer 116 (i-InP multiplier layer 116), a first positively doped (p-type) indium phosphide (p-InP) buffer layer 118 (first p-InP buffer layer 118), and a second positively doped (p-type) indium phosphide (p-InP) buffer layer 120 (second p-InP buffer layer 120).

The APD structure 104 may operate in, for example but without limitation, Geiger mode sensitive from about 930 nm to about 1600 nm with InGaAs absorber or to about 1064 nm with InGaAsP absorber, linear mode, or other phtotodiode operation mode. A Geiger-mode APD (G-APD) identifies a class of semiconductor photodetectors based on a reverse biased p-n junction in which a photo-generated carrier can trigger an avalanche event due to an impact ionization mechanism. This device is able to detect low intensity signals down to a single-photon level and to register arrival times of the photons with a jitter of a few tens of picoseconds. G-APDs, like the linear-mode APD, exploit a photon-triggered avalanche current of a reverse biased p-n junction to detect an incident radiation. A fundamental difference between G-APD and linear-mode APD is that G-APDs are specifically designed to operate with a reverse bias voltage above the breakdown voltage (on the contrary linear-mode APDs operate at a bias lesser than the breakdown voltage).

As shown in FIG. 1, a general SWIR APD such as the APD 100 may comprise a function region comprising an absorber (the InGaAsP layer 110 and the InGaAsP graded layer 112) and the i-InP multiplier layer 116 sandwiched between wider-bandgap P layer (the first p-InP buffer layer 118, and the second p-InP buffer layer 120) and N layer (the n-InP layer 108). The operation wavelength range is determined by a bandgap of the absorber and that of the wider-bandgap material in an optical path (the InP substrate 122, the second p-InP buffer layer 120 and the first p-InP buffer layer 118). In the InP/InGaAs material system, an upper bond of this range is defined by a bandgap of InGaAs lattice-matched to InP, and it is about 1.65 um at 300 K. InP is normally the substrate and used for the P and N layers to construct the P-I-N structure. A bandgap of InP determines the lower bond of the operation wavelength range, which is about 0.92 um.

A P-I-N diode is a diode with a wide, lightly doped 'near' intrinsic semiconductor region between a p-type semiconductor and an n-type semiconductor region. The p-type and n-type regions are typically heavily doped because they are used for ohmic contacts. The wide intrinsic region is in contrast to an ordinary PN diode. The wide intrinsic region makes the P-I-N diode an inferior rectifier (one typical function of a diode), but it makes the P-I-N diode suitable for attenuators, fast switches, photodetectors, and high voltage power electronics applications.

Figure 5:
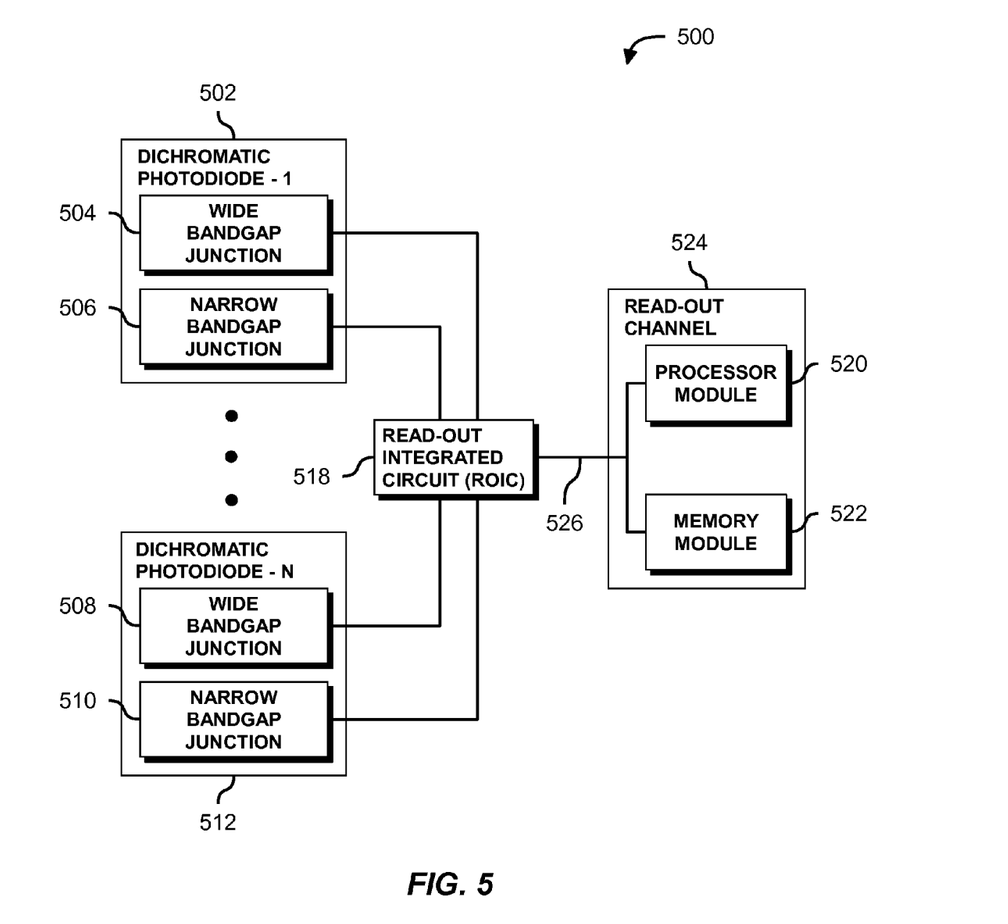
FIG. 5 is an illustration of an exemplary dichromatic photodiode array system according to an embodiment of the disclosure.

The n-InGaAs layer 106 provides a top electrical conductor operable to couple the APD structure 104 via read-out integrated circuit (ROIC) 518 (FIG. 5) to a read-out channel (ROC) 524 (FIG. 5).

The n-InP layer 108 provides a lattice matched N-layer for the APD structure 104.

The InP substrate 122 comprises a substrate base on which the APD structure 104 is constructed. The InP substrate 122 provides structural support to the APD structure 104.

Figure 2:
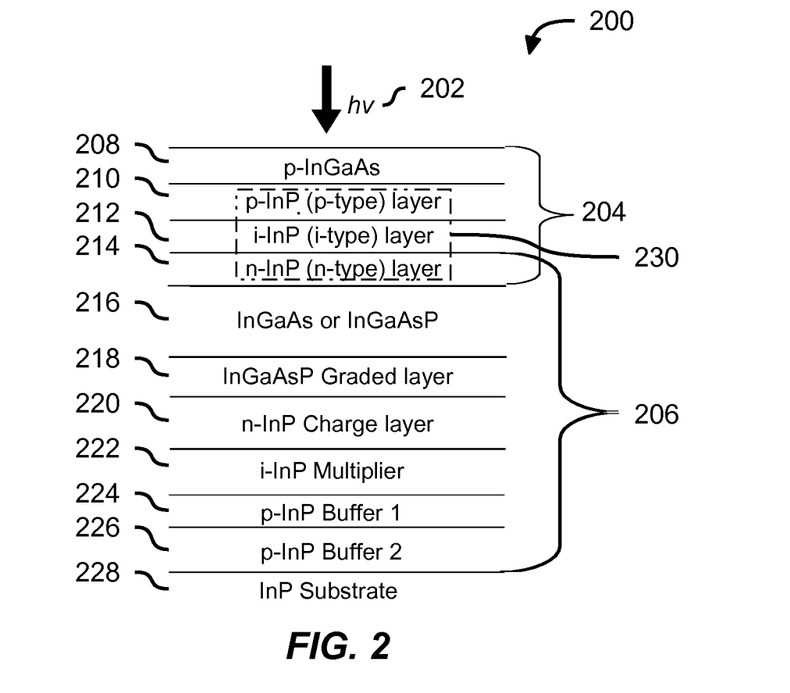
FIG. 2 is an illustration of an exemplary front illuminated dichromatic photodiode comprising a dual-junction structure according to an embodiment of the disclosure.

FIG. 2 is an illustration of an exemplary front illuminated dichromatic photodiode 200 (dichromatic photodiode 200) comprising a dual-junction structure 204/206 according to an embodiment of the disclosure. The dichromatic photodiode 200 comprises a wide bandgap junction 204, a narrow bandgap junction 206, and an InP substrate 228. Both the wide bandgap junction 204 and the narrow bandgap junction 206 comprise a negatively doped (n-type) indium phosphide layer 214 (n-InP layer 214).

The wide bandgap junction 204 comprises a positively doped indium gallium arsenide (p-InGaAs) layer 208 (a p-InGaAs layer 208), a positively doped (p-type) indium phosphide layer 210 (p-InP layer 210), an intrinsic (i-type) indium phosphide layer 212 (i-InP layer 212), and the n-InP layer 214. The i-InP layer 212 is sandwiched by the p-InP layer 210 and the n-InP layer 214.

The narrow bandgap junction 206 comprises the n-InP layer 214, an InGaAs/InGaAsP absorption layer 216, an InGaAsP graded layer layer 218, a negatively doped indium phosphide (n-InP) charge layer 220 (n-InP charge layer 220), an intrinsic indium phosphide (i-InP) multiplier layer 222 (i-InP multiplier layer 222), a first positively doped (p-type) indium phosphide (p-InP) buffer layer 224 (first p-InP buffer layer 224), and a second positively doped (p-type) indium phosphide (p-InP) buffer layer 226 (second p-InP buffer layer 226).

The wide bandgap junction 204 covers, without limitation, from about 400 nm to about 930 nm, and the narrow bandgap junction 206 covers, without limitation, from about 930 nm to about 1064 nm (InGaAsP absorber) or about 1600 nm (InGaAs absorber). By inserting a homo-junction with the lattice-matched wide bandgap material in front of the SWIR photodiode, another photodiode working in the shorter wavelength range with no optical impact to the SWIR photodetector is obtained. The material selection in FIG. 2 is based on but not limited to the InP/InGaAs material system. For example, lattice-matched indium aluminum arsenide (InAlAs) can also be used to replace all the InP layers in FIG. 2.

A light from a visible range to about 0.92 um will be absorbed in the P and I regions in a top InP P-I-N homo-junction 230 (lattice matched homo-junction 230) comprising the p-InP layer 210, the i-InP layer 212, and the n-InP layer 214. As long as a thickness of the p-InP layer 210 is comparable with the electron diffusion length, the lattice matched homo-junction 230 will have a good absorption and collection efficiency. By applying a high electric field to the i-InP layer 212, impact ionization can occur and the lattice matched homo-junction 230 can operate as an APD. A wavelength longer than 0.92 um can pass through the lattice matched homo-junction 230 with little loss and be absorbed in a SWIR photodiode such as the narrow bandgap junction 206.

Figure 3:
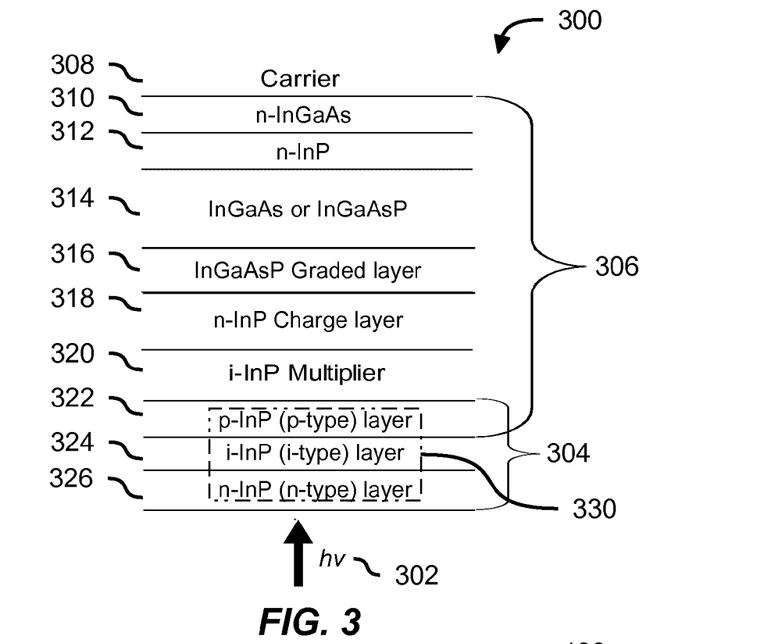
FIG. 3 is an illustration of an exemplary back illuminated dichromatic photodiode comprising a dual-junction structure after InP substrate removal according to an embodiment of the disclosure.

FIG. 3 is an illustration of an exemplary back illuminated dichromatic photodiode 300 (dichromatic photodiode 300) comprising a dual-junction structure 304/306 after InP substrate removal according to an embodiment of the disclosure. The dichromatic photodiode 300 comprises a carrier 308, a wide bandgap junction 304 and a narrow bandgap junction 306. Both the wide bandgap junction 304 and the narrow bandgap junction 306 comprise a p-InP layer 322.

The wide bandgap junction 304 comprises the p-InP layer 322, an i-InP layer 324, and an n-InP layer 326. The i-InP layer 324 is sandwiched by the p-InP layer 322 and the n-InP layer 326.

The narrow bandgap junction 306 comprises an n-InGaAs layer 310, an n-InP layer 312, an InGaAs/InGaAsP absorption layer 314, an InGaAsP graded layer 316, an n-InP charge layer 318, an i-InP multiplier layer 320, and the p-InP layer 322.

As shown in FIG. 3, a back-illuminated structure can be implemented by growing an N-I-P InP homo-junction 330 (lattice matched homo-junction 330) comprising the i-InP layer 324 sandwiched by the n-InP layer 326, and the p-InP layer 322, followed by a SWIR photodiode structure such as the narrow bandgap junction 306. After removing the InP substrate 228, the structure will work for back illumination hv 302. The substrate removal will facilitate the back side illumination and microlens integration. The carrier 308 may be a sacrificial process carrier or a read-out integrated circuit (ROIC). The wide bandgap junction 304 covers, without limitation, from about 400 nm to about 930 nm, and the narrow bandgap junction 306 covers, without limitation, from about 930 nm to about 1064 nm (InGaAsP absorber) or about 1600 nm (InGaAs absorber).

In order to operate both the wide bandgap junction 304 and the narrow bandgap junction 306 in the structures independently, an additional contact should be made to the n-InP layer 214 in FIG. 2 and to the p-InP layer 322 in FIG. 3, in addition to a top contact (not shown) and a bottom contact (not shown). The top contact may be coupled to, for example but without limitation, the p-InGaAs layer 208, the carrier 308, or other appropriate contact, of their respective dichromatic photodiode 200 and 300. The bottom contact may be coupled to, for example but without limitation, the InP substrate 228 and the n-InP layer 326, of their respective dichromatic photodiode 200 and 300. Thus, three terminals (e.g., top contact, additional contact, and bottom contact) may be coupled to, for example but without limitation, the p-InGaAs layer 208, the n-InP layer 214, and the InP substrate 228 in the dichromatic photodiode 200.

Similarly, three terminals may be coupled to, for example but without limitation, the carrier 308, the p-InP layer 322, and the n-InP layer 326 in the dichromatic photodiode 300. The three terminals, may be used to operate respective wide bandgap junction 204/304 and narrow bandgap junction 206/306 separately or in combination. With the three terminals, the wide bandgap junction 204/304 and the narrow bandgap junction 206/306 can be operated in either linear mode or Geiger mode individually and provide a flexibility for image applications. If one of the junctions is operated in Geiger mode, an appropriate absorber needs to be inserted between the two junctions to avoid the possible optical crosstalk due to a secondary emission.

For a long-range Light Detection and Ranging (LIDAR) applications, both junctions can be operated in Geiger mode and maximize the detection efficiency. For example, with an about 1064 nm pulse laser and its second harmonic at about 532 nm, an array with these dual-junction pixels will generate 3-D images in both wavelengths. Due to their transmission difference in water, a fusion of the two 3-D images may be very effective, for example, in remote sensing of the coastal regime.

Figure 4:
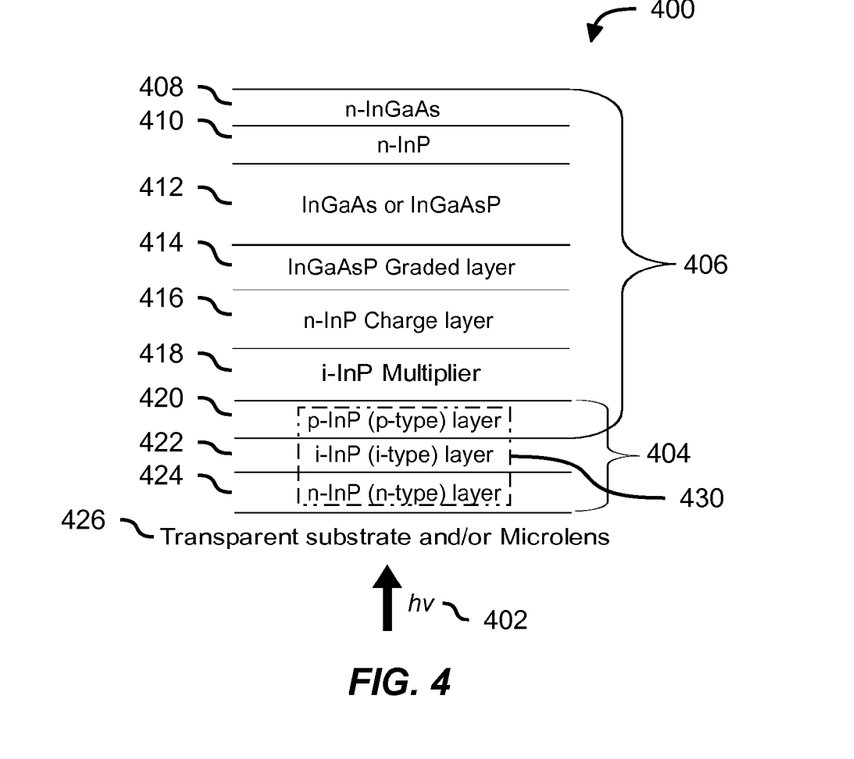
FIG. 4 is an illustration of an exemplary back illuminated dichromatic photodiode comprising a dual-junction structure coupled to a transparent substrate and/or microlens according to an embodiment of the disclosure.

FIG. 4 is an illustration of an exemplary back illuminated dichromatic photodiode (dichromatic photodiode 400) comprising a dual-junction structure 404/406 coupled to a transparent substrate and/or micro-lens 426 according to an embodiment of the disclosure. The dichromatic photodiode 400 comprises a wide bandgap junction 404 and a narrow bandgap junction 406. Both the wide bandgap junction 404 and the narrow bandgap junction 406 comprise a p-InP layer 420. The wide bandgap junction 404 comprises the p-InP layer 420, an i-InP layer 422, and an n-InP layer 424.

As shown in FIG. 4, a back-illuminated structure can be implemented by growing an N-I-P InP homo-junction 430 (a lattice matched homo-junction 430) comprising the i-InP layer 422 sandwiched by the n-InP layer 424, and the p-InP layer 420, followed after a SWIR photodiode structure such as the narrow bandgap junction 406. The narrow bandgap junction 406 also comprises an n-InGaAs layer 408, an n-InP layer 410, an InGaAs/InGaAsP absorption layer 412, an InGaAsP graded layer layer 414, an n-InP charge layer 416, an i-InP multiplier layer 418, and the p-InP layer 420.

The dual junction structure 404/406 results after InP substrate removal and transferred to a transparent substrate or a microlens. The substrate removal will facilitate the back side illumination and microlens integration. The microlens will help to increase the array fill factor. The wide bandgap junction 404 covers, without limitation, from about 400 nm to about 930 nm, and the narrow bandgap junction 406 covers, without limitation, from about 930 nm to about 1064 nm (InGaAsP absorber) or about 1600 nm (InGaAs absorber).

This dichromatic structure embodiment can be incorporated with various photodiodes, including PIN, avalanche photodiode (APD), and photo conductors. Due to the compact nature of this integration, this dichromatic photodiodes is easy to be scaled to large-format arrays.

The lattice matched homo-junction 230/330/430 described above comprises indium phosphide (InP) in the i-InP layer 324, n-InP layer 326, and the p-InP layer 322 as an exemplary material. However, other intrinsic (i-type), positively doped (p-type), and negatively doped (n-type) materials may also be used for constructing these layers as explained in more detail below.

FIG. 5 is an illustration of a dichromatic photodiode array system (system 500) according to an embodiment of the disclosure. A practical system 500 may comprise any number of input modules, any number of processor modules, any number of memory modules, and any number of other modules. The illustrated system 500 depicts a simple embodiment for ease of description. These and other elements of the system 500 are interconnected together, allowing communication between the various elements of system 500. In one embodiment, these and other elements of the system 500 may be interconnected together via a communication link 526. Those of skill in the art will understand that the various illustrative blocks, modules, circuits, and processing logic described in connection with the embodiments disclosed herein may be implemented in hardware, computer-readable software, firmware, or any practical combination thereof.

To illustrate clearly this interchangeability and compatibility of hardware, firmware, and software, various illustrative components, blocks, modules, circuits, and steps are described generally in terms of their functionality. Whether such functionality is implemented as hardware, firmware, or software depends upon the particular application and design constraints imposed on the overall system. Those familiar with the concepts described herein may implement such functionality in a suitable manner for each particular application, but such implementation decisions should not be interpreted as causing a departure from the scope of the present disclosure.

The system 500 may have functions, material, and structures that are similar to the embodiments shown in FIGS. 2-4. Therefore, common features, functions, and elements may not be redundantly described here.

The system 500 may comprise any number of dichromatic photodiodes 1-N such as a dichromatic photodiode-1 502, a dichromatic photodiode-N 512 (Nth dichromatic photodiode), the read-out integrated circuit 518, and the read-out channel 524. The number N can be any number greater than or equal to one. The number N may be chosen accordingly for an application for which the photodiodes 1-N are used. For example but without limitation, a diochromatic 1080p High Definition Television (HDTV) imaging array may require an N equal to 2,073,600.

The system 500 may represent, for example but without limitation, a photo diode array.

The dichromatic photodiode-1 502 comprises a wide bandgap junction 504 and a narrow bandgap junction 506. Similarly, the dichromatic photodiode-N 512 comprises a wide bandgap junction 508 and a narrow bandgap junction 510.

The read-out integrated circuit 518 is configured to receive wideband and narrow band signals from the dichromatic photodiodes 1-N.

The read-out channel 524 is configured to register the light detections of the dichromatic photodiodes 1-N. The read-out channel 524 comprises a processor module 520, and memory module 522.

The processor module 520 comprises processing logic that is configured to carry out the functions, techniques, and processing tasks associated with the operation of the system 500. In particular, the processing logic is configured to support the system 500 described herein. The processor module 520 may be implemented, or realized, with a general purpose processor, a content addressable memory, a digital signal processor, an application specific integrated circuit, a field programmable gate array, any suitable programmable logic device, discrete gate or transistor logic, discrete hardware components, or any combination thereof, designed to perform the functions described herein. In this manner, a processor may be realized as a microprocessor, a controller, a microcontroller, a state machine, or the like.

A processor may also be implemented as a combination of computing devices, e.g., a combination of a digital signal processor and a microprocessor, a plurality of microprocessors, one or more microprocessors in conjunction with a digital signal processor core, or any other such configuration.

The memory module 522 may comprise a data storage area with memory formatted to support the operation of the system 500. The memory module 522 is configured to store, maintain, and provide data as needed to support the functionality of the system 500. In practical embodiments, the memory module 522 may comprise, for example but without limitation, a non-volatile storage device (e.g., non-volatile semiconductor memory, hard disk device, optical disk device), a random access storage device (e.g., SRAM, DRAM), or any other form of storage medium known in the art.

The memory module 522 may be coupled to the processor module 520 and configured to store, for example but without limitation, photon arrival timings, light spectrums frequency values, a database, a computer program that is executed by the processor module 520, an operating system, an application program, tentative data used in executing a program, or other light processing software. Additionally, the memory module 522 may represent a dynamically updating database containing a table for updating the database. The memory module 522 may be coupled to the processor module 520 such that the processor module 520 can read information from and write information to the memory module 522. For example, as mentioned above, the processor module 520 may access the memory module 522 to access the light spectrums frequency values, photon arrival timings, or other applicable optical processing data.

As an example, the processor module 520 and memory module 522 may reside in respective application specific integrated circuits (ASICs). The memory module 522 may also be integrated into the processor module 520. In an embodiment, the memory module 522 may comprise a cache memory for storing temporary variables or other intermediate information during execution of instructions to be executed by the processor module 520.

Figure 6:
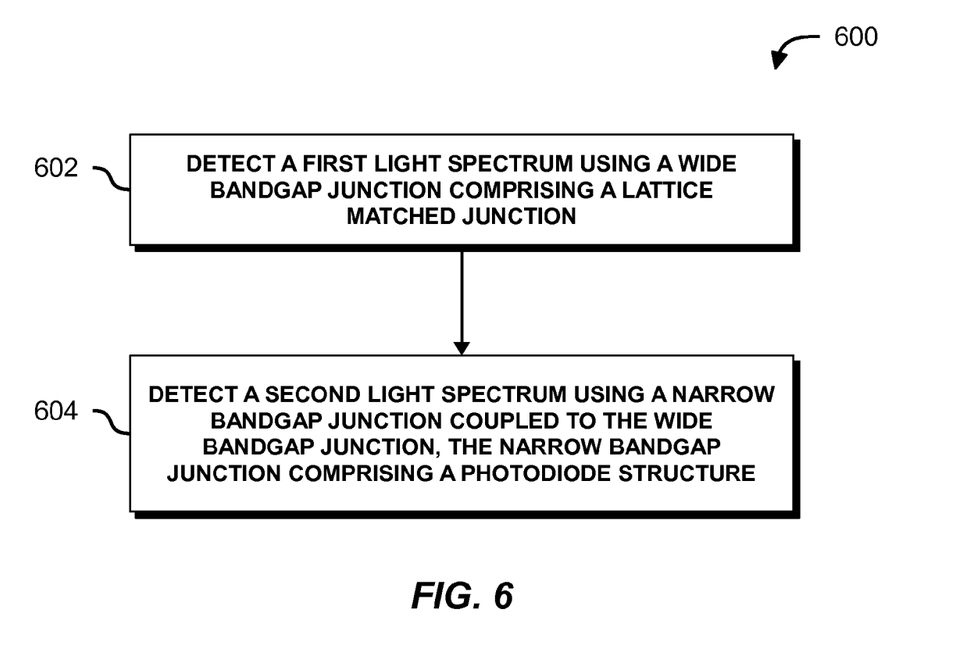
FIG. 6 is an illustration of an exemplary flowchart showing a process for dichromatic photodetection according to an embodiment of the disclosure.

FIG. 6 is an illustration of an exemplary flowchart showing a process 600 for dichromatic photodetection according to an embodiment of the disclosure. The various tasks performed in connection with the process 600 may be performed mechanically, by software, hardware, firmware, a computer-readable medium having computer executable instructions for performing the processes methods, or any combination thereof.

It should be appreciated that process 600 may include any number of additional or alternative tasks, the tasks shown in FIG. 6 need not be performed in the illustrated order, and the process 600 may be incorporated into a more comprehensive procedure or process having additional functionality not described in detail herein. For illustrative purposes, the following description of process 600 may refer to elements mentioned above in connection with FIGS. 2-5.

In practical embodiments, portions of the process 600 may be performed by different elements of the system 500 such as: the dichromatic photodiode-1 502, the dichromatic photodiode-N 512, the read-out integrated circuit 518, and the read-out channel 524, etc. Process 600 may have functions, material, and structures that are similar to the embodiments shown in FIGS. 2-5. Therefore, common features, functions, and elements may not be redundantly described here.

Process 600 may begin by detecting a first light spectrum via a wide bandgap junction such as the wide bandgap junction 204/304/404 comprising a lattice matched homo-junction such as the lattice matched homo-junction 230/330/430 (task 602). The lattice matched homo-junction 230/330/430 may comprise, for example but without limitation, an intrinsic (i-type) layer sandwiched by a positively doped (p-type) layer and a negatively doped (n-type) layer, or other homo-junction photodiode. The intrinsic (i-type) layer, the positively doped (p-type) layer, and the negatively doped (n-type) layer each may comprise, for example but without limitation, indium phosphide, indium aluminum arsenide (InAlAs), mercury cadmium telluride, or other photoactive material. For example, as explained above, the lattice matched homo-junction 230/330/430 may comprise an intrinsic (i-type) indium phosphide layer such as the i-InP layer 212/324/422 sandwiched by a positively doped (p-type) indium phosphide layer such as the p-InP layer 210/322/420 and a negatively doped (n-type) indium phosphide layer such as the n-InP layer 214/326/424. The first light spectrum may comprise, for example but without limitation, an SWIR spectrum.

Process 600 may continue by detecting a second light spectrum via a narrow bandgap junction such as the narrow bandgap junction 206/306/406 coupled to the wide bandgap junction 204/304/404, the narrow bandgap junction 206/306/406 comprising an avalanche photodiode (APD) structure (task 604). The second light spectrum may comprise, for example but without limitation, a visible light spectrum.

Figure 7:
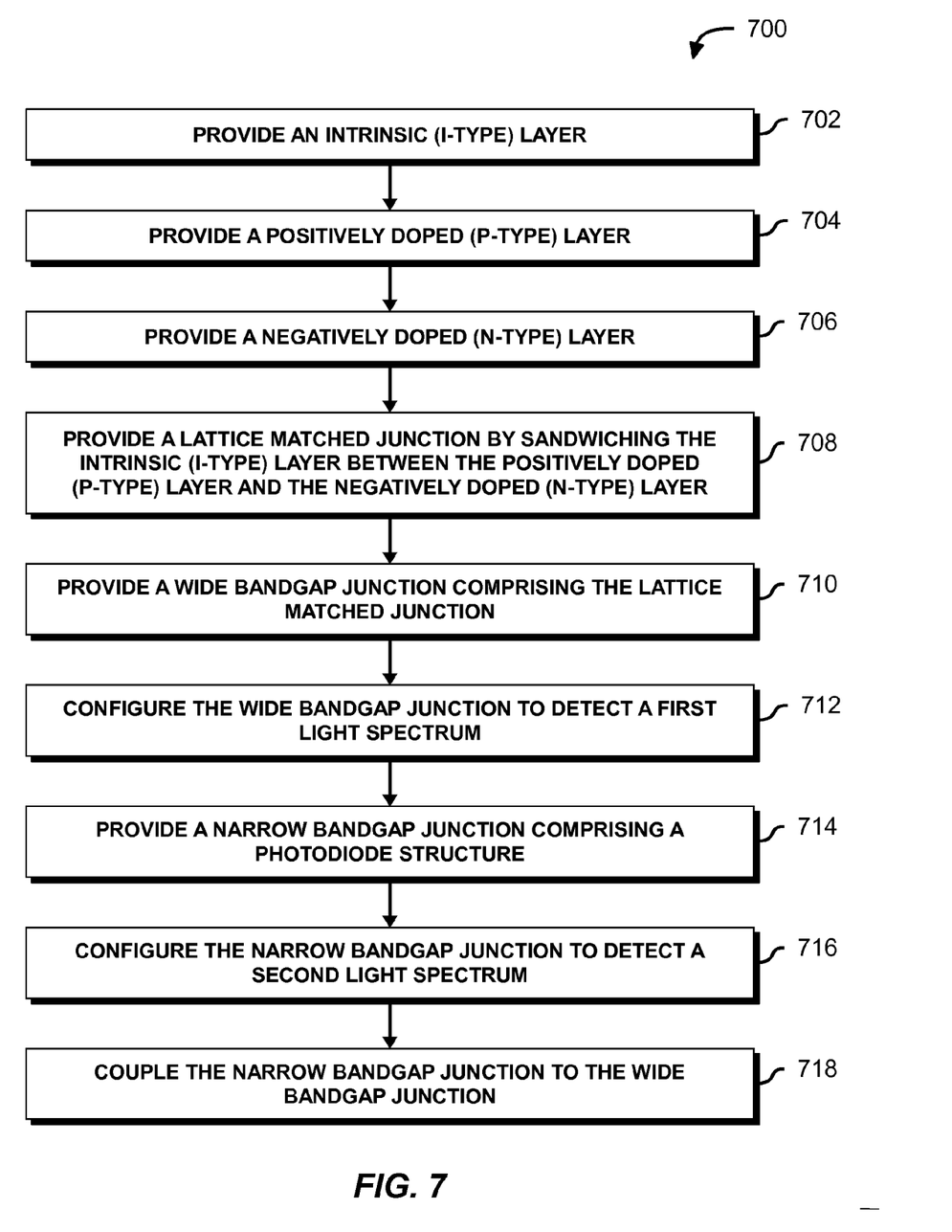
FIG. 7 is an illustration of an exemplary flowchart showing a process for providing a dichromatic photodiode according to an embodiment of the disclosure.

FIG. 7 is an illustration of an exemplary flowchart showing a process 700 for providing a dichromatic photodiode according to an embodiment of the disclosure. The various tasks performed in connection with process 700 may be performed mechanically, by software, hardware, firmware, a computer-readable medium having computer executable instructions for performing the processes methods, or any combination thereof. For illustrative purposes, the following description of the process 700 may refer to elements mentioned above in connection with FIGS. 2-5.

It should be appreciated that the process 700 may include any number of additional or alternative tasks, the tasks shown in FIG. 7 need not be performed in the illustrated order, and the process 700 may be incorporated into a more comprehensive procedure or process having additional functionality not described in detail herein. In practical embodiments, portions of the process 700 may be performed by different elements of the system 500 such as: the dichromatic photodiode-1 502, the dichromatic photodiode-N 512, the read-out integrated circuit 518, and the read-out channel 524, etc. Process 700 may have functions, material, and structures that are similar to the embodiments shown in FIGS. 2-5. Therefore, common features, functions, and elements may not be redundantly described here.

Process 700 may begin by providing an intrinsic (i-type) layer such as the i-InP layer 212/324/422 (task 702).

Process 700 may continue by providing a positively doped (p-type) layer such as the p-InP layer 210/322/420 (task 704).

Process 700 may continue by providing a negatively doped (n-type) layer such as the n-InP layer 214/326/424 (task 706).

Process 700 may continue by providing a lattice matched junction such as the lattice matched homo-junction 230/330/430 by sandwiching the intrinsic (i-type) layer between the positively doped (p-type) layer and the negatively doped (n-type) layer (task 708).

Process 700 may continue by providing a wide bandgap junction such as the wide bandgap junction 204/306/404 comprising the lattice matched homo-junction 230/330/430 (task 710).

Process 700 may continue by configuring the wide bandgap junction 204/306/404 to detect a first light spectrum (task 712). The first light spectrum may comprise, for example but without limitation, a short-wavelength infrared (SWIR) spectrum.

Process 700 may continue by providing a narrow bandgap junction such as the narrow bandgap junction 206/306/406 comprising an avalanche photodiode (APD) structure (task 714).

Process 700 may continue by configuring the narrow bandgap junction 206/306/406 to detect a second light spectrum (task 716). The second light spectrum may comprise, for example but without limitation, a visible light spectrum.

Process 700 may continue by coupling the narrow bandgap junction 206/306/406 to the wide bandgap junction 204/306/404 (task 718).

In this manner, the embodiments of the disclosure provide a dichromatic photodiode that greatly reduces difficulty in integration of multiple band photo detection and imaging. Resulting photodiodes and arrays cover multiple optical bands with high efficiency and density, which give a competitive edge in camera image quality, integration, weight, volume, and power consumption.

In this document, the terms "computer program product", "computer-readable medium", "computer readable storage medium", and the like may be used generally to refer to media such as, for example, memory, storage devices, or storage unit. These and other forms of computer-readable media may be involved in storing one or more instructions for use by the processor module 608 to cause the processor module 608 to perform specified operations. Such instructions, generally referred to as "computer program code" or "program code" (which may be grouped in the form of computer programs or other groupings), when executed, enable power utilization scheduling methods of the system 600.

The above description refers to elements or nodes or features being "connected" or "coupled" together. As used herein, unless expressly stated otherwise, "connected" means that one element/node/feature is directly joined to (or directly communicates with) another element/node/feature, and not necessarily mechanically. Likewise, unless expressly stated otherwise, "coupled" means that one element/node/feature is directly or indirectly joined to (or directly or indirectly communicates with) another element/node/feature, and not necessarily mechanically. Thus, although FIGS. 2-5 depict example arrangements of elements, additional intervening elements, devices, features, or components may be present in an embodiment of the disclosure.

Terms and phrases used in this document, and variations thereof, unless otherwise expressly stated, should be construed as open ended as opposed to limiting. As examples of the foregoing: the term "including" should be read as meaning "including, without limitation" or the like; the term "example" is used to provide exemplary instances of the item in discussion, not an exhaustive or limiting list thereof; and adjectives such as "conventional," "traditional," "normal," "standard," "known" and terms of similar meaning should not be construed as limiting the item described to a given time period or to an item available as of a given time, but instead should be read to encompass conventional, traditional, normal, or standard technologies that may be available or known now or at any time in the future.

Likewise, a group of items linked with the conjunction "and" should not be read as requiring that each and every one of those items be present in the grouping, but rather should be read as "and/or" unless expressly stated otherwise. Similarly, a group of items linked with the conjunction "or" should not be read as requiring mutual exclusivity among that group, but rather should also be read as "and/or" unless expressly stated otherwise. Furthermore, although items, elements or components of the disclosure may be described or claimed in the singular, the plural is contemplated to be within the scope thereof unless limitation to the singular is explicitly stated. The presence of broadening words and phrases such as "one or more," "at least," "but not limited to" or other like phrases in some instances shall not be read to mean that the narrower case is intended or required in instances where such broadening phrases may be absent.

As used herein, unless expressly stated otherwise, "operable" means able to be used, fit or ready for use or service, usable for a specific purpose, and capable of performing a recited or desired function described herein. In relation to systems and devices, the term "operable" means the system and/or the device is fully functional and calibrated, comprises elements for, and meets applicable operability requirements to perform a recited function when activated. In relation to systems and circuits, the term "operable" means the system and/or the circuit is fully functional and calibrated, comprises logic for, and meets applicable operability requirements to perform a recited function when activated.

The invention claimed is:

1. A dichromatic photodiode comprising:
a wide bandgap junction comprising a lattice matched junction operable to detect a first light spectrum; and
a narrow bandgap junction coupled to the wide bandgap junction, and comprising a photodiode structure operable to detect a second light spectrum, wherein the wide bandgap junction comprises a P-I-N junction and the narrow bandgap junction comprises a N-I-P junction, or the wide bandgap junction comprises a N-I-P junction and the narrow bandgap junction comprises a P-I-N junction, and
the photodiode structure comprises an indium gallium arsenide phosphide (InGaAsP) graded layer, a negatively doped indium phosphide (n-InP) charge layer, an intrinsic indium phosphide (i-InP) multiplier layer, and a positively doped (p-type) indium phosphide (p-InP) buffer layer.

2. The dichromatic photodiode according to claim 1, wherein the lattice matched junction comprises an intrinsic (i-type) indium phosphide layer sandwiched by a positively doped (p-type) indium phosphide layer and a negatively doped (n-type) indium phosphide layer.

3. The dichromatic photodiode according to claim 1, wherein the lattice matched junction comprises an intrinsic (i-type) layer sandwiched by a positively doped (p-type) layer and a negatively doped (n-type) layer.

4. The dichromatic photodiode according to claim 3, wherein the intrinsic (i-type) layer, the positively doped (p-type) layer, and the negatively doped (n-type) layer each comprise at least one member selected from the group consisting of: indium phosphide, indium aluminum arsenide (InAlAs), and mercury cadmium telluride.

5. The dichromatic photodiode according to claim 1, wherein the wide bandgap junction further comprises a positively doped indium gallium arsenide (p-InGaAs) layer.

6. The dichromatic photodiode according to claim 1, further comprising a carrier coupled to the narrow bandgap junction.

7. The dichromatic photodiode according to claim 1, further comprising at least one of a transparent substrate and a micro-lens, coupled to the wide bandgap junction.

8. The dichromatic photodiode according to claim 1, wherein the photodiode structure further comprises at least one member selected from the group consisting of: an indium gallium arsenide (InGaAs) layer, and an indium gallium arsenide phosphide (InGaAsP) layer.

9. The dichromatic photodiode according to claim 1, wherein the positively doped (p-type) indium phosphide (p-InP) buffer layer comprises a first positively (p-type) doped indium phosphide (p-InP) buffer layer and a second positively (p-type) doped indium phosphide (p-InP) buffer layer.

10. The dichromatic photodiode according to claim 1, wherein the first light spectrum comprises a short-wavelength infrared (SWIR) spectrum.

11. The dichromatic photodiode according to claim 1, wherein the second light spectrum comprises a visible light spectrum.

12. A method for dichromatic photodetection, the method comprising:
detecting a first light spectrum using a wide bandgap junction comprising a lattice matched junction; and
detecting a second light spectrum using a narrow bandgap junction coupled to the wide bandgap junction, the narrow bandgap junction comprising a photodiode structure, wherein the wide bandgap junction comprises a P-I-N junction and the narrow bandgap junction comprises a N-I-P junction, or the wide bandgap junction comprises a N-I-P junction and the narrow bandgap junction comprises a P-I-N junction, and the photodiode structure comprises an indium gallium arsenide phosphide (InGaAsP) graded layer, a negatively doped indium phosphide (n-InP) charge layer, an intrinsic indium phosphide (i-InP) multiplier layer, and a positively doped (p-type) indium phosphide (p-InP) buffer layer.

13. The method according to claim 12 wherein the lattice matched junction comprises an intrinsic (i-type) indium phosphide layer sandwiched by a positively doped (p-type) indium phosphide layer and a negatively doped (n-type) indium phosphide layer.

14. The method according to claim 12, wherein the lattice matched junction comprises an intrinsic (i-type) layer sandwiched by a positively doped (p-type) layer and a negatively doped (n-type) layer.

15. The method according to claim 14, wherein the intrinsic (i-type) layer, the positively doped (p-type) layer, and the negatively doped (n-type) layer each comprise at least one member selected from the group consisting of: indium phosphide, indium aluminum arsenide (InAlAs), and mercury cadmium telluride.

16. The method according to claim 12, wherein the wide bandgap junction further comprises a positively doped indium gallium arsenide (p-InGaAs) layer.

17. A method for providing a dichromatic photodiode, the method comprising:
providing a wide bandgap junction comprising a lattice matched junction;
configuring the wide bandgap junction to detect a first light spectrum;
providing a narrow bandgap junction comprising a photodiode structure;
configuring the narrow bandgap junction to detect a second light spectrum; and
coupling the narrow bandgap junction to the wide bandgap junction, wherein the wide bandgap junction comprises a P-I-N junction and the narrow bandgap junction comprises a N-I-P junction, or the wide bandgap junction comprises a N-I-P junction and the narrow bandgap junction comprises a P-I-N junction, and
the photodiode structure comprises an indium gallium arsenide phosphide (InGaAsP) graded layer, a negatively doped indium phosphide (n-InP) charge layer, an intrinsic indium phosphide (i-InP) multiplier layer, and a positively doped (p-type) indium phosphide (p-InP) buffer layer.

18. The method according to claim 17, further comprising:
providing an intrinsic (i-type) layer;
providing a positively doped (p-type) layer;
providing a negatively doped (n-type) layer; and
providing the lattice matched junction by sandwiching the intrinsic (i-type) layer between the positively doped (p-type) layer and the negatively doped (n-type) layer.

19. The method according to claim 18, wherein the intrinsic (i-type) layer, the positively doped (p-type) layer, and the negatively doped (n-type) layer each comprise at least one member selected from the group consisting of: indium phosphide, indium aluminum arsenide (InAlAs), and mercury cadmium telluride.

20. A dichromatic photodiode comprising:
a wide bandgap junction comprising a lattice matched junction operable to detect a first light spectrum; and
a narrow bandgap junction coupled to the wide bandgap junction, and comprising a photodiode structure operable to detect a second light spectrum, wherein the photodiode structure comprises an indium gallium arsenide phosphide (InGaAsP) graded layer, a negatively doped indium phosphide (n-InP) charge layer, an intrinsic indium phosphide (i-InP) multiplier layer, and a positively doped (p-type) indium phosphide (p-InP) buffer layer.

21. The dichromatic photodiode according to claim 20, wherein the photodiode structure further comprises at least one member selected from the group consisting of: an indium gallium arsenide (InGaAs) layer, and an indium gallium arsenide phosphide (InGaAsP) layer.

22. The dichromatic photodiode according to claim 20, wherein the positively doped (p-type) indium phosphide (p-InP) buffer layer comprises a first positively (p-type) doped indium phosphide (p-InP) buffer layer and a second positively (p-type) doped indium phosphide (p-InP) buffer layer.

* * * * *